United States Patent

Sugimoto et al.

[11] Patent Number: 5,929,385
[45] Date of Patent: Jul. 27, 1999

[54] AC OXIDE SUPERCONDUCTOR WIRE AND CABLE

[75] Inventors: Masahiro Sugimoto; Akio Kimura, both of Imaichi; Masanao Mimura, Nikko; Hideo Ishii; Shoichi Honjo, both of Tokyo; Yoshihiro Iwata, Yokohama, all of Japan

[73] Assignees: The Furukawa Electric Co., Ltd; The Tokyo Electric Power Company, both of Tokyo, Japan

[21] Appl. No.: 08/850,184

[22] Filed: May 2, 1997

[30] Foreign Application Priority Data

May 10, 1996 [JP] Japan ................................. 8-140993

[51] Int. Cl.$^6$ ........................................................ H01B 12/00
[52] U.S. Cl. .................................... 174/125.1; 505/231
[58] Field of Search ............................ 174/125.1, 15.4, 174/15.5; 505/230, 231, 813, 886, 887

[56] References Cited

U.S. PATENT DOCUMENTS 3,730,967  5/1973  Nicol ..................................... 174/125.1
4,673,775  6/1987  Nigol et al. ........................... 174/130

FOREIGN PATENT DOCUMENTS 2309986   11/1976  France ................................ 174/125.1
6-139839   5/1994  Japan ................................. 174/125.1
WO 96/08045  3/1996  WIPO .

*Primary Examiner*—Hyung-Sub Sough
*Attorney, Agent, or Firm*—Frishauf, Holtz, Goodman, Langer & Chick, P.C.

[57] ABSTRACT

Disclosed is an AC oxide superconductor round wire including a metal matrix, and a plurality of superconductor filaments embedded in the metal matrix, wherein the superconductor filaments are twisted at a twist pitch $L_p$ satisfying the following relation.

$$2L_{c1} < L_p \leq 2L_{c2}$$

$$L_{c1} = 2\{(2\rho \cdot d_f \cdot J_c)/(\mu_o \cdot dH/dt)\}^{1/2}$$

$$L_{c2} = 2\{(2\rho \cdot d_b \cdot J_{cb})/(\mu_o \cdot dH/dt)\}^{1/2}$$

8 Claims, 5 Drawing Sheets

AC OXIDE SUPERCONDUCTOR WIRE AND CABLE

BACKGROUND OF THE INVENTION

The present invention relates to an oxide superconductor wire and, more particularly, to an AC oxide superconductor wire with a large critical current and a reduced AC loss, a method of manufacturing the same, and an AC oxide superconductor wire cable.

As methods of reducing the AC loss in an oxide superconductor wire formed by embedding a large number of superconductor filaments in a metal matrix, decreasing the pitch of twist of each superconductor filament is known in addition to decreasing the diameter of each filament and increasing the specific resistance of the metal matrix.

The relationship between the twist pitch and the AC loss will be explained below.

Figure 1A:
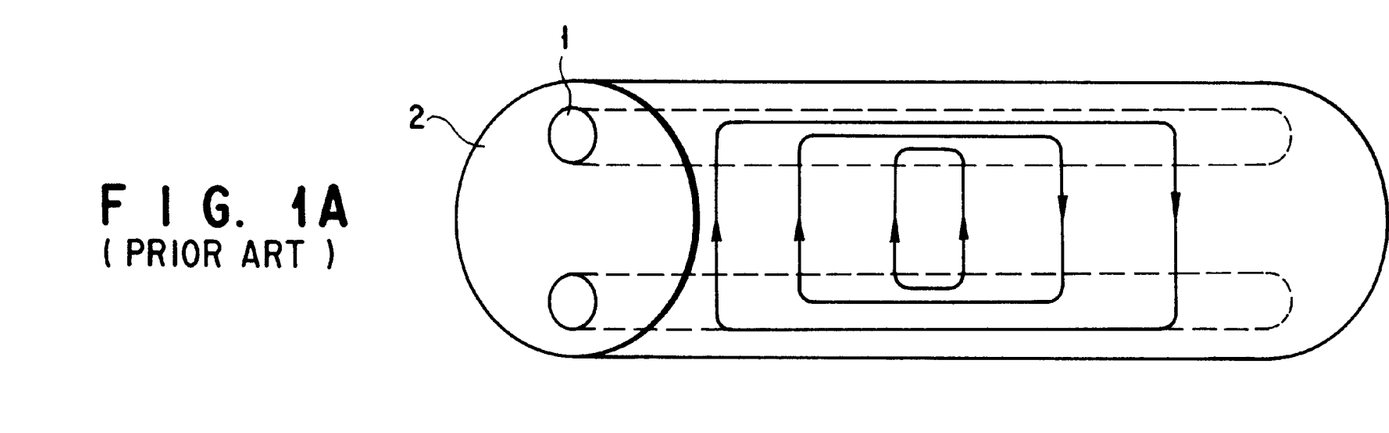
FIGS. 1A and 1B are views for explaining a coupling current in a conventional oxide superconductor wire.
Figure 1B:
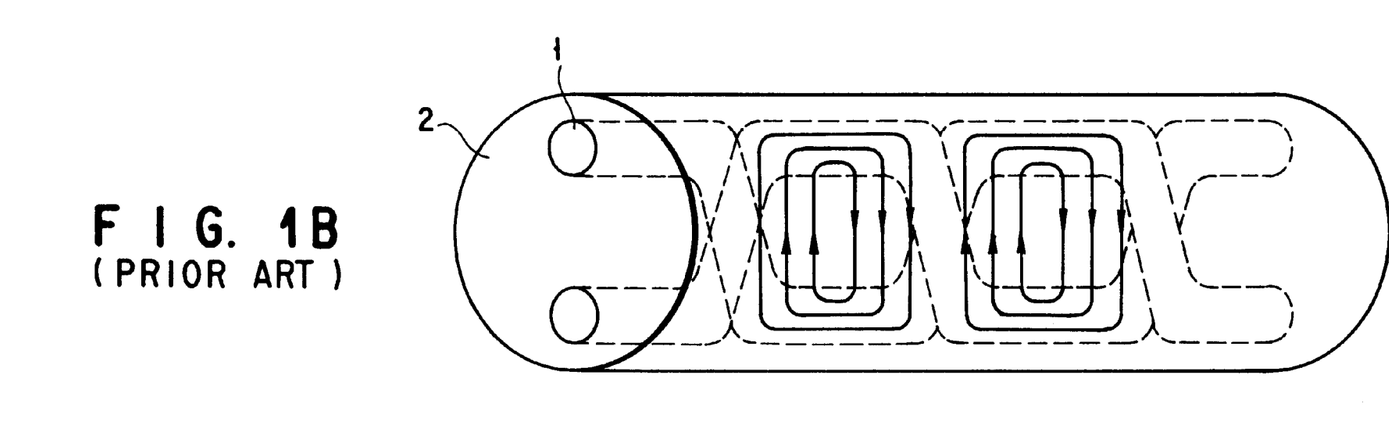

FIGS. 1A and 1B are views for explaining the coupling current. In FIGS. 1A and 1B, reference numeral 1 denotes a superconductor filament; and 2, a metal matrix.

When a magnetic field is applied to a superconductor, a screening current flows in the form of a loop and prevents the magnetic flux from entering into the superconductor. The purpose of a multicore construction is to trap the magnetic flux inside and reflux a screening current in each superconductor filament, thereby increasing the stability. Even in such a multicore wire, as indicated by the arrows in FIG. 1A, screening currents can flow through the metal matrix between the superconductor filaments 1. These screening currents decay in the course of time due to the resistance of the metal matrix 2. If the length of the wire is increased, however, the inductance of the screening current loop increases, and this prolongs the decay time of the screening current. This state is called electromagnetic coupling. In thisk coupling state, a multicore wire behaves as if it were a single superconductor, and this eliminates the effect of a multicore construction.

To reduce this electromagnetic coupling, twisting the superconductor filaments 1 is effective. When the filaments are twisted, as shown in FIG. 1B, screening currents are refluxed in a region ½ of the twist pitch. Consequently, the inductance of the screening current loop decreases, and this accelerates the decay of the screening currents. When the decay time becomes shorter than the fluctuation period of the magnetic field, the coupling state as described above is prevented. A critical length $L_c$ by which the decay time of the screening current is shorter than the fluctuation period of the magnetic field is determined by a specific resistance $\rho$ of the metal matrix 2, a diameter $d_f$ and a critical current density $J_c$ of the superconductor filament 1, and a change rate $dH/dt$ of an external magnetic field, and is represented by the following equation.

$$L_c = 2\{(2\rho \cdot d_f \cdot J_c)/(\mu_o \cdot dH/dT)\}^{1/2}$$

That is, when the superconductor filament 1 is twisted at a pitch not larger than twice the critical length $L_c$, it is possible to prevent a coupling current from flowing and reduce the AC loss.

Unfortunately, in an oxide superconductor wire it is very difficult to twist the superconductor filament 1 at a pitch not larger than twice the critical length $L_c$. For example, when an oxide superconductor multicore tape wire (tape thickness 0.25 mm, tape width 3 mm, superconductor filament thickness 15 $\mu$m, and critical current density $J_c = 10^4$ A/cm$^2$), as a general oxide superconductor wire, including silver with a specific resistance of $2.5 \times 10^{-9}$ $\Omega \cdot$m as the metal matrix 2, is applied with an AC magnetic field having change rate $\mu_o \cdot dH/dt = 1.2$ T/sec in a direction perpendicular to the longitudinal direction of the wire and parallel to the wide surfaces of the wire, the critical length $L_c$ is 5 mm, so the twist pitch must be not larger than 10 mm which is twice as large as 5 mm. Additionally, in actual large-current AC cables or AC coils for generating a high magnetic field, the field conditions are more severe, and the critical length $L_c$ further decreases.

It is, however, extremely difficult to twist an oxide superconductor wire of a practical size at a pitch not larger than twice this small critical length $L_c$. Therefore, it is conventionally reckoned that when it is not possible to twist an oxide superconductor wire at a pitch not larger than twice the critical length $L_c$, the AC loss increases due to electromagnetic coupling of the superconductor filaments 1, so no AC loss reducing effect resulting from twisting can be expected.

An AC oxide superconductor cable manufactured by winding a plurality of AC oxide superconductor wires into a plurality of layers around a core member is also available. In this AC oxide superconductor cable, if the impedance (the sum of the resistance and the inductance) varies from one layer to another, a larger AC current flows in a layer with a lower impedance. This produces a localized current flow, which causes an anomalous increase of the AC loss. To make the impedances of the individual layers equal to each other, various methods by which only the inductance components of the layers are adjusted and equalized have been proposed. However, no practical method of equalizing the resistance components of the layers is known.

Assume that the inductances of the layers are made equal to each other and consequently the individual wires have the same ratio of the power supply current to the critical current and the layers have the same power supply current density. In this case, the farther the layer from the core, the stronger the self-magnetic field of the layer and the larger the AC loss (resistance component) resulting from magnetization, so the impedance of the layer increases for the same inductance component. Accordingly, a larger current flows into wires arranged in inner layer, having a relatively low impedance, and the AC loss in the inner layers increases. As a consequence, a large current flows this time in wires arranged in outer layers having a relatively low impedance, so a phenomenon of localized current flow occurs continuously. This brings about an abnormal increase of the AC loss in the whole cable.

BRIEF SUMMARY OF THE INVENTION

It is an object of the present invention to provide an AC oxide superconductor wire in which a decrease of the critical current is suppressed and the AC loss is greatly reduced.

It is another object of the present invention to provide a method of manufacturing an AC oxide superconductor wire in which a decrease of the critical current is suppressed and the AC loss is greatly reduced.

It is still another object of the present invention to provide an AC oxide superconductor cable in which a decrease of the critical current is suppressed and the AC loss is greatly reduced.

According to the present invention, there is provided an AC oxide superconductor round wire comprising a metal matrix, and a plurality of superconductor filaments embedded in the metal matrix, wherein the superconductor filaments are twisted at a twist pitch $L_p$ satisfying the following relation:

$$2L_{c1} < L_p \leq 2L_{c2}$$

$$L_{c1} = 2\{(2\rho \cdot d_f \cdot J_c)/(\mu_o \cdot dH \cdot dt)\}^{1/2}$$

$$L_{c2} = 2\{(2\rho \cdot d_b \cdot J_{cb})/(\mu_o \cdot dH \cdot dt)\}^{1/2}$$

(where $\rho$ is a specific resistance ($\Omega \cdot m$) oDf the metal matrix, $d_f$ is a diameter (m) of the superconductor filament, $d_b$ is a diameter (m) of a bundle of superconductor filaments, $J_c$ is a critical current density (A/m$^2$) of the superconductor filament, $J_{cb}$ is a critical current density (A/m$^2$) of the bundle of superconductor filaments, $\mu_o$ is permeability (H/m) in vacuum, and dH/dt is a change rate (A/m/sec) of a magnetic field).

According to the present invention, there is provided an AC oxide superconductor tape wire comprising a metal matrix, and a plurality of superconductor filaments embedded in the metal matrix, wherein the superconductor filaments are twisted at a twist pitch $L_p$ satisfying the following relation:

$$2L_{c1} < L_p \leq 2L_{c2}$$

$$L_{c1} = 2\{(2\rho \cdot d_{ft} \cdot J_c)/(\mu_o \cdot dH \cdot dt)\}^{1/2}$$

$$L_{c2} = 2\{(2\rho \cdot d_{bt} \cdot J_{cb})/(\mu_o \cdot dH \cdot dt)\}^{1/2}$$

(where $\rho$ is a specific resistance ($\Omega \cdot m$) of the metal matrix, $d_{ft}$ is a thickness (m) of the superconductor filament, $d_{bt}$ is a thickness (m) of a bundle of superconductor filaments, $J_c$ is a critical current density (A/m$^2$) of the superconductor filament, $J_{cb}$ is a critical current density (A/m$^2$) of the bundle of superconductor filaments, $\mu_o$ is permeability (H/m) in vacuum, and dH/dt is a change rate (A/m/sec) of a magnetic field).

According to the present invention, there is provided a method of manufacturing the AC oxide superconductor round or tape wire described above, comprising the steps of arranging a plurality of rod members made from powder of an oxide superconductor or precursor thereof (a substance which is transformed into a superconductor) in a metal matrix and drawing a resultant composite wire, heat-treating the drawn composite wire having a circular section, twisting the heat-treated composite wire, and repeatedly drawing or rolling and heat-treating the twisted composite wire.

According to the present invention, there is provided an AC oxide superconductor cable manufactured by arranging a plurality of AC oxide superconductor round or tape wires described above into a plurality of layers around a core member, wherein the farther a layer from the core member the closer the twist pitch $L_p$ to $2L_{c1}$, and the closer a layer to the core member the closer the twist pitch $L_p$ to $2L_{c2}$.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The present inventors have found that when the superconductor filament twist pitch is set in a predetermined range, twisting can be easily performed and the AC loss can be reduced while a decrease of the critical current is suppressed. The present invention is based on this finding.

The characteristic feature of an AC oxide superconductor wire of the present invention is that a twist pitch $L_p$ of a superconductor filament is so set as to satisfy $2L_{c1} < L_p \leq 2L_{c2}$. The pitch is desirably set as close to $2L_{c1}$ as possible as long as the critical current does not decrease.

If $L_p$ is $2L_{c1}$ or less, twisting becomes very difficult to perform and the critical current easily decreases. If $L_p$ is larger than $2L_{c2}$, it is impossible to obtain the AC loss reducing effect of the present invention.

The type of oxide superconductor usable in the AC oxide superconductor wire of the present invention is not particularly limited. Preferable examples are bismuth-based, yttrium-based, and thalliulm-based superconductors having a high critical temperature.

Examples of the metal matrix usable in the AC oxide superconductor wire of the present invention are silver and silver alloys such as Ag—Au, Ag—Cu, and Ag—Mg.

Also, an example of the core member usable in an AC oxide superconductor cable of the present invention is a flexible hollow member made of stainless steel or aluminum.

To equalize the current densities in the individual layers in the AC oxide superconductor cable of the present invention, an insulator is preferably interposed between these layers. A polyimide-based film is an example of this insulator.

In the AC oxide superconductor wire of the present invention with the above construction, the twist pitch of superconductor filaments of the oxide superconductor wire is set in a predetermined range. Accordingly, twisting can be easily performed, and the AC loss can be reduced while a decrease in the critical current is suppressed.

In a method of manufacturing the AC oxide superconductor wire of the present invention, a heat treatment is performed before twisting. Therefore, a decrease of the critical current can be suppressed when the oxide superconductor wire is twisted at a small pitch.

Furthermore, the AC oxide superconductor cable of the present invention uses AC oxide superconductor wires whose twist pitches are so selected that the wires in the individual layers have equal AC losses when a rated current is applied to the cable. This prevents localization of the power supply current in each layer and thereby prevents an unusual increase of the AC loss.

Embodiments of the present invention will be described in detail below with reference to the accompanying drawings.

Figure 2A:
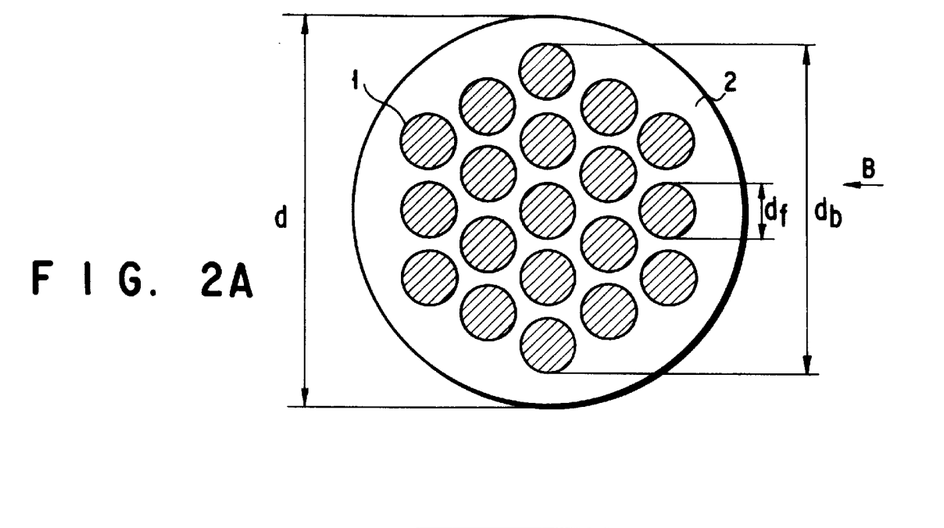
FIGS. 2A and 2B are views showing an oxide superconductor wire according to one embodiment of the present invention.
Figure 2B:
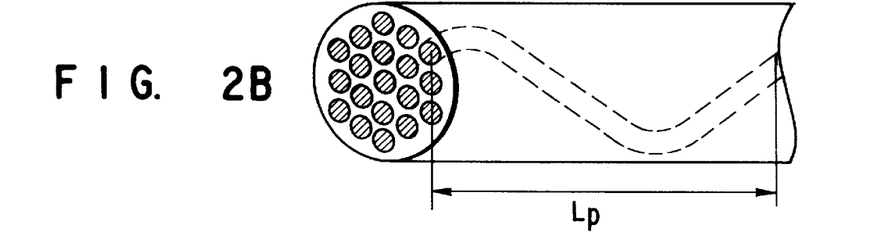

FIGS. 2A and 2B are views showing an oxide superconductor round wire according to one embodiment of the present invention. FIG. 2A shows the sectional structure, and FIG. 2B shows the twisted state of one superconductor filament in the oxide superconductor round wire.

Referring to FIGS. 2A and 2B, a superconductor filament 1 is made from an oxide superconductor, and the oxide superconductor round wire is formed by embedding a plurality of superconductor filaments 1 in a metal matrix 2 such as silver. Each superconductor filament 1 embedded in the metal matrix 2 is twisted at a predetermined pitch $L_p$. A critical length $L_c$ of this oxide superconductor round wire is given by the following equation.

$$L_c = 2\{(2\rho \cdot d_f \cdot J_c)/(\mu_o \cdot dH/dt)\}^{1/2}$$

In such a superconductor wire, the critical current is known to increase as the matrix ratio (the volume ratio of the metal matrix when it is assumed that the volume of the superconductor filament is 1) is decreased, and the AC loss reduces as the filament diameter is decreased. When the filament diameter is decreased and the number of the superconductor filaments is increased accordingly while the matrix ratio is decreased, the intervals between the superconductor filaments are decreased. When this wire is drawn and heat-treated, the superconductor filaments deform and partially come very close to each other or contact each other. This is equivalent to forming a portion where the filaments electromagnetically readily couple to each other and a portion not like that in an external magnetic field and essentially increasing the diameter of the superconductor filament, thereby making an equivalent filament diameter $d_{eff}$ larger than an actual filament diameter $d_f$ and an equivalent critical current density $J_{ceff}$ smaller than $J_c$ of the filament. As a consequence, an equivalent critical length $L_{ceff}$ increases as indicated by the following equation.

$$L_{ceff} = 2\{(2\rho d_{eff} \cdot J_{ceff})/(\mu_o \cdot dH/dt)\}^{1/2}$$

The equivalent filament diameter $d_{eff}$ takes an intermediate value between the actual filament diameter $d_f$ of the superconductor filament 1 and a diameter $d_b$ of a bundle of superconductor filaments. Also, $J_{ceff}$ takes an intermediate value between $J_c$ and $J_{cb}$. Accordingly, the equivalent critical length $L_{ceff}$ takes an intermediate value between $L_{c1}$ and $L_{c2}$ below.

$$L_{c1} = 2\{(2\rho \cdot d_f \cdot J_c)/(\mu_o \cdot dH/dt)\}^{1/2}$$

$$L_{c2} = 2\{(2\rho \cdot d_b \cdot J_{cb})/(\mu_o \cdot dH/dt)\}^{1/2}$$

where $d_b$ is the diameter (m) of the bundle of superconductor filaments and $J_{cb}$ is the critical current density (A/m²) of the bundle of superconductor filaments.

As indicated by the above equations, $L_{c1}$ and $L_{c2}$ are calculated by taking account of the change rate of a magnetic field in which the wire is used.

The diameter $d_f$ of the superconductor filament 1 is given by the following equation although it can also be actually measured.

$$d_f = d/\{(1+\lambda)N\}^{1/2}$$

(where d is the outside diameter (m) of the wire, $\lambda$ is the matrix ratio, and N is the number of the superconductor filaments 1)

The critical current density $J_c$ is given by the following equation.

$$J_c = I_c/(1+\lambda))/(\pi d^2/4)$$

(where $I_c$ is the critical current (A) of the wire.)

The critical current density $J_{cb}$ of the bundle of superconductor filaments is given by the following equation.

$$J_{cb} = I_c/(\pi d_b^2/4)$$

Figure 3A:
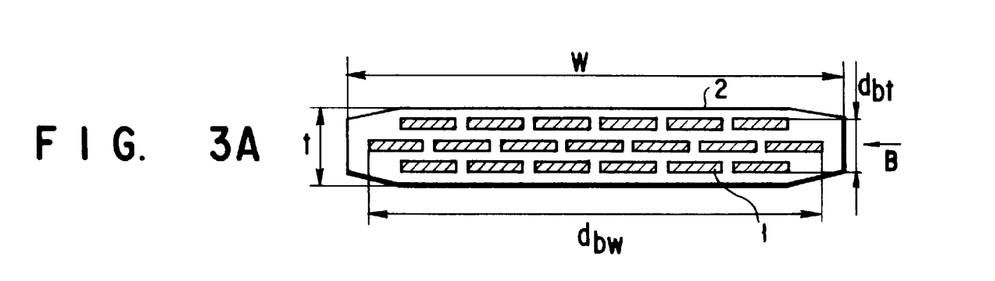
FIGS. 3A and 3B are views showing an oxide superconductor tape wire according to another embodiment of the present invention.
Figure 3B:
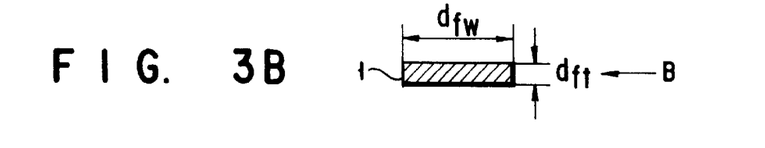

FIGS. 3A and 3B are views showing an oxide superconductor tape wire according to another embodiment of the present invention. In this oxide superconductor tape wire, a superconductor filament 1 is similarly twisted at a pitch of $L_p$. In this embodiment, a thickness $d_{ft}$ of the superconductor filament 1 perpendicular to a magnetic field applied to the wire is used in place of the diameter $d_f$ of the superconductor filament 1. Also, a thickness $d_{bt}$ of a bundle of superconductor filaments perpendicular to the magnetic field applied to the wire is used in place of the diameter of the bundle of superconductor filaments.

Since a tape wire is molded by rolling or drawing a round wire, the thickness $d_{ft}$ of the superconductor filament 1 varies from one filament to another in the wire. Therefore, an average value is calculated by using mathematical expressions.

In the present invention the thickness of the superconductor wire, the thickness of the superconductor filament and the thickness of the bundle of superconductor filaments are dimensions measured in a direction perpendicular to a plane including the twist pitch direction (the direction of the critical length, the direction of the wire length) and the direction of a fluctuating magnetic field applied in use (see FIGS. 2A to 3B, 8A to 10D).

The thickness $d_{ft}$ of the superconductor filament 1 is given by the following equation.

$$d_{ft} = t/\{(1+\lambda)N\}^{1/2}$$

(where t is the thickness (m) of the wire.)

The critical current density $J_c$ is given by the following equation.

$$J_c = I_c(1+\lambda) + tw$$

(where w is the width (m) of the wire.)

The critical current density $J_{cb}$ of the bundle of superconductor filaments is given by the following equation.

$$J_{cb} = I_c/d_{bt}d_{bw}$$

(where $d_{bt}$ and $d_{bw}$ are the thickness and width, respectively, of the bundle of superconductor filaments.)

Note that the diameter and thickness of the bundle of superconductor filaments can be obtained by the following methods.

(1) Actual measurement using section of wire

The distance between the outside of one outermost superconductor filament and the outside of another outermost superconductor filament in a position of 180° point symmetry is measured as the diameter and thickness of the bundle of superconductor filaments (see FIGS. 2A and 3A).

As the thickness of the bundle of superconductor filaments, a value actually measured in the thickest portion of a section perpendicular to the longitudinal direction of a wire is used. This is because the number of magnetic fluxes linked is largest in a thick portion, so this portion has the largest effect on the magnitude of the AC loss of a wire.

(2) Calculations

The case of a round wire is described by way of example.

The outer diameter Di of a set of wires accommodated in a tube finally used in the manufacture of an AC oxide superconductor wire is divided by the outside diameter Do of the tube. The quotient is multiplied by the outer diameter d of the final wire. That is, the thickness of the bundle of the filaments is given by the following equation.

$$d_b = d \times Di/Do$$

It can be roughly estimated using the inner diameter of the tube finally used instead of the outer diameter of the set of wires accommodated in the tube.

EXAMPLE 1

An oxide superconductor mixed powder prepared to have a composition of (Bi+Pb):Sr:Ca:Cu=2:2:2:3 was molded into a rod with an outside diameter of 10 mm. The rod was inserted into a silver tube with an inside diameter of 10.5 mm and an outside diameter of 15 mm, thereby obtaining a composite structure. This composite structure was processed into a hexagonal wire with an opposite side distance of 2.0 mm by using a wire drawing machine. 19 such hexagonal wires were inserted into a silver tube 11 mm in inside diameter and 15 mm in outside diameter, and the resultant material was drawn until the wire diameter became 1.5 mm.

Subsequently, a heat treatment was performed at 300° C. for 1 hr, and twisting was performed at pitches of 3 to 90 mm. Thereafter, rolling or drawing and the heat treatment were repeated to form a tape wire 0.24 mm thick and 3.3 mm wide and a round wire 1 mm in outer diameter. The filament thickness of the tape wire was 26 $\mu$m, and the filament diameter of the round wire was 110 $\mu$m. Also, the silver ratio was 3.5, and the final twist pitches were 7 to 200 mm.

EXAMPLE 2

Figure 4:
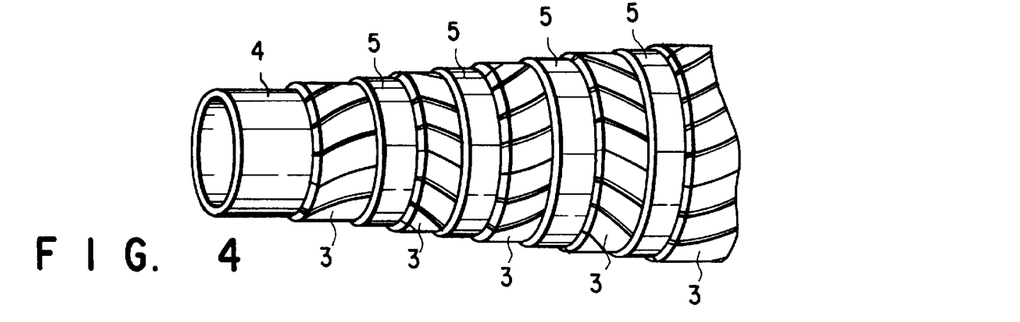
FIG. 4 is a view showing an oxide superconductor cable according to still another embodiment of the present invention.

A plurality of oxide superconductor tape wires 3 manufactured following the same procedure as in Example 1 were wound into a plurality of layers around a core member, thereby manufacturing an AC oxide superconductor cable. That is, as shown in FIG. 4, the oxide superconductor tape wires 3 were spirally wound to form five layers, with a 0.35-mm thick insulator 5 interposed between them, around a core member 4 with an outer diameter of 30 mm, thereby manufacturing an oxide superconductor cable 35.2 mm in outside diameter.

In this oxide superconductor cable, 29, 30, 31, 32, and 33 oxide superconductor tape wires 3 were arranged from the innermost or first layer to the outermost or fifth layer; i.e., a total of 155 tape wires 3 were used. The critical current of the cable estimated by the critical current of the tape wire times the number of tape wires was 2325 A. The rated AC power supply current (50 Hz) of this cable was set at a peak value of 1000 A, and magnetic field calculations upon application of the rated current were performed for a case wherein the individual wires had the same power supply current (the individual layers had the same power supply current density). From the calculated average change rate of the magnetic field applied to the oxide superconductor tapes 3 in each layer, $L_{c1}$ and $L_{c2}$ of each tape were calculated.

The electromagnetic coupling state of the superconductor filaments of the tape wires in each layer was adjusted, and the twist pitches of the tapes were set at 44 mm, 23 mm, 16 mm, 12 mm, and 9 mm from the innermost or first layer to the outermost or fifth layer so that the AC losses in these layers were equalized. These twist pitches were so set that the farther the layer from the core the closer the twist pitch to $2L_{c1}$, and the closer the layer to the core the closer the twist pitch to $2L_{c2}$.

Conventional Example

An oxide superconductor mixed powder prepared to have a composition of (Bi+Pb):Sr:Ca:Cu=2:2:2:3 was molded into a rod with an outside diameter of 10 mm. The rod was inserted into a silver tube with an inside diameter of 10.5 mm and an outside diameter of 15 mm, thereby obtaining a composite structure. This composite structure was processed into a hexagonal wire with an opposite side distance of 2.0 mm by using a wire drawing machine. 19 such hexagonal wires were inserted into a silver tube 11 mm in inside diameter and 15 mm in outside diameter, and the resultant material was drawn until the wire diameter became 1.5 mm.

Thereafter, rolling or drawing and a heat treatment were repeated to form a tape wire 0.24 mm thick and 3.3 mm wide and a round wire 1 mm in outer diameter. The filament thickness of the tape wire was 26 $\mu$m, the filament diameter of the round wire was 110 $\mu$m, and the silver ratio was 3.5.

Comparative Example

An oxide superconductor mixed powder prepared to have a composition of (Bi+Pb):Sr:Ca:Cu=2:2:2:3 was molded into a rod with an outside diameter of 10 mm. The rod was inserted into a silver tube with an inside diameter of 10.5 mm and an outside diameter of 15 mm, thereby obtaining a composite structure. This composite structure was processed into a hexagonal wire with an opposite side distance of 2.0 mm by using a wire drawing machine. 19 such hexagonal wires were inserted into a silver tube 11 mm in inside diameter and 15 mm in outside diameter, and the resultant material was drawn until the wire diameter became 1.5 mm. Subsequently, twisting was performed at pitches of 3 to 90 mm without performing any heat treatment.

Thereafter, rolling or drawing and a heat treatment were repeated to form a tape wire 0.24 mm thick and 3.3 mm wide and a round wire 1 mm in outer diameter. The filament thickness of the tape wire was 26 $\mu$m, and the filament diameter of the round wire was 110 $\mu$m. Also, the silver ratio was 3.5, and the final twist pitches were 7 to 200 mm.

The AC losses of the manufactured wires were measured by using a magnetization method. The measurement conditions were such that the field amplitude was fixed to 30 mT, and the field change rate $\mu_o \cdot dH/dt$ was changed by changing the frequency. Each sample was formed by binding 75 40-mm long wires. These wires were insulated from each other, and the end portions of the sample were polished so that the superconductor filaments did not contact each other. A fluctuating magnetic field was applied in a direction perpendicular to the longitudinal direction of the wire and parallel to the wide surfaces of the tape wire. The critical current (self-magnetic field, 77 K) was also measured by the four-terminal method. This critical current was defined by a current value when a voltage of 1 $\mu$V/cm was generated between voltage taps.

Figure 5:
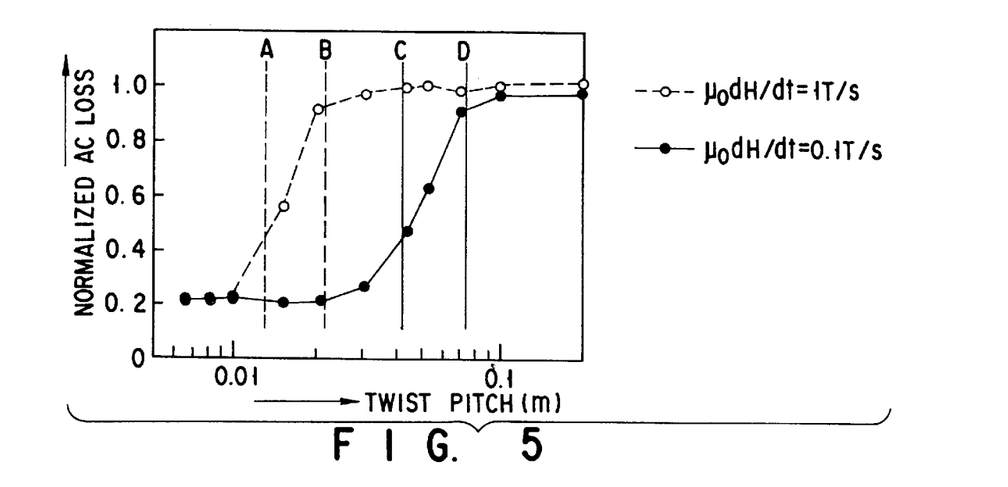
FIG. 5 is a graph showing changes of the AC loss as a function of the twist pitch.

FIG. 5 shows the twist pitch dependence of the AC loss of the tape wire of the example of the present invention, which is normalized by the AC loss in the conventional example. Referring to FIG. 5, a dotted line A indicates $2L_{c1}$ when $\mu_o \cdot dH/dt=1$ T/s; a dotted line B, $2L_{c2}$ when $\mu_o \cdot dH/dt=1$ T/s; a solid line C, $2L_{c1}$ when $\mu_o \cdot dH/dt=0.1$ T/s; and a solid line D, $2L_{c2}$ when $\mu_o \cdot dH/dt=0.1$ T/s.

Note that $2L_{c1}$ and $2L_{c2}$ were obtained on the basis of the calculation results of parameters of the following tape wire.

$$J_c = 15 \times \{1/(0.24 \times 3.3 \times 10^{-6})\} \times (1 + 3.5)$$
$$= 85.2 \times 10^6 \ [A/m^2]$$

$$\lambda_b = (15^2 - 10.5^2)/10^2 = 1.148$$

$$J_{cb} = 15 \times \{1/(0.24 \times 3.3 \times 10^{-6})\} \times (1 + 1.148)$$
$$= 40.7 \times 10^6 \ [A/m^2]$$

$$\rho = 2.5 \times 10^{-9} \ (\Omega \cdot m)$$

(specific resistance of silver for 77K)

$$d_f = t/\{(1+\lambda)N\}^{1/2}$$
$$= 0.24 \times 10^{-3}/\{(1+3.5) \times 19\}^{1/2}$$
$$= 2.6 \times 10^{-5} \ m = 26 \ \mu m$$

where $\lambda b$ is the area of a matrix portion when the area of a bundle of filaments is 1.

The critical length $L_c$ can be calculated by substituting these parameters into the following equation.

$$L_c = 2\{(2\rho \cdot d_f J_c)/(\mu_o \cdot dH/dt)\}^{1/2}$$

(1) $2L_{c1}$ when $\mu_o \cdot dH/dt=1$ T/s is 0.0133 as indicated by the dotted line A in FIG. 5.

(2) $2L_{c2}$ when $\mu_o \cdot dH/dt=1$ T/s is 0.0228 as indicated by the dotted line B in FIG. 5.

(3) $2L_{c1}$ when $\mu_o \cdot dH/dt=0.1$ T/s is 0.042 as indicated by the solid line C in FIG. 5.

(4) $2L_{c2}$ when $\mu_o \cdot dH/dt=0.1$ T/s is 0.072 as indicated by the solid line D in FIG. 5.

As is apparent from FIG. 5, both when $\mu_o \cdot dH/dt=1$ T/s and $\mu_o \cdot dH/dt=0.1$ T/s, the AC loss decreased with a decrease of the twist pitch in the region of $2L_{c1}<L_p<2L_{c2}$. Also, as the field change rate $\mu_o \cdot dH/dt$ increased, $L_{c1}$ and $L_{c2}$ shifted to smaller values. Accordingly, electromagnetic coupling of the filaments became conspicuous, and this in,reased the AC loss. That is, even when the twist pitch is larger than $2L_{c1}$, if the pitch is $2L_{c2}$ or less, an increase of the AC loss caused by electromagnetic coupling of the filaments can be suppressed.

This AC loss reducing effect was similarly confirmed in the round wire.

Figure 6:
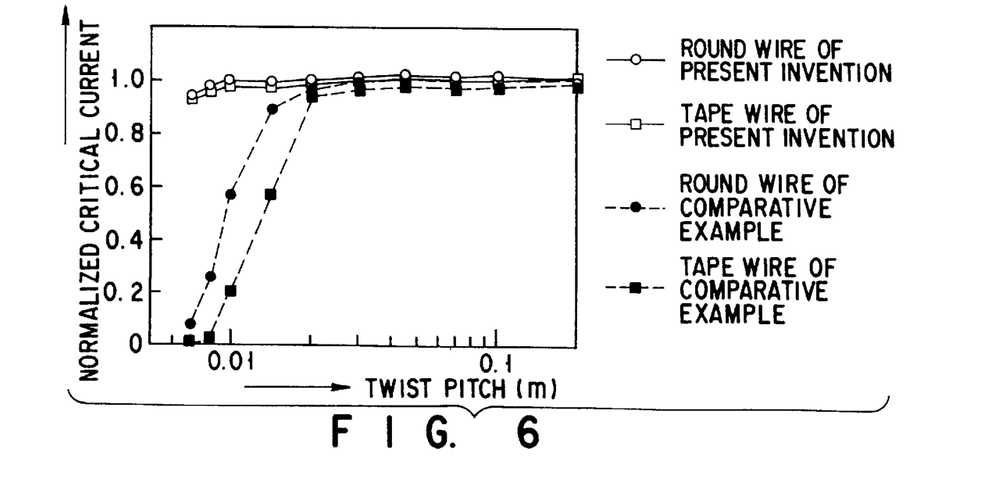
FIG. 6 is a graph showing changes of the critical current as a function of the twist pitch.

FIG. 6 shows the twist pitch dependence of the critical current in each of the example of the present invention and the comparative example, which is normalized by the critical current obtained when no twisting was performed in these examples. When no twisting was performed, the critical currents of the tape wire and the round wire of the example of the present invention were 15A and 5A, respectively, and the critical currents of the tape wire and the round wire of the comparative example were nearly identical to these values.

As shown in FIG. 6, in the tape wire of the example of the present invention, the critical current hardly decreased and remained almost constant even when the twist pitch decreased. In contrast, in the tape wire of the comparative example, the critical current decreased with a decrease of the twist pitch in a region where the pitch was about 20 mm or less. Analogously, the critical current of the round wire of the example of the present invention hardly decreased even when the twist pitch was small. In contrast, the critical current of the round wire of the comparative example decreased when the pitch was about 15 mm or less. It follows from the foregoing that an appropriate heat treatment before twisting improves the twist processability and suppresses a decrease of the critical current caused by twisting of the wire.

In the above example of the present invention, the temperature and time of the heat treatment before twisting were 300° C. and 1 hr, respectively. However, the heating temperature and time are not necessarily limited to these values. That is, it is desirable to set optimum temperature and time within the ranges of 200° C. to 400° C. and 3 hr or less, respectively.

Meanwhile, the AC loss of the oxide superconductor cable of Example 2 when the rated current (1000 A) was applied was measured by the four-terminal method using a lock-in amplifier. The measured value of the AC loss of the cable was almost identical with a value obtained by multiplying the calculated values of the power supply loss and the magnetization loss of the wire by the number of wires used. This effect is considered attributable to the fact that a localized current flow in each layer was suppressed because the AC losses of the individual layers were nearly equal to each other, so no abnormal increase of the AC loss occurred.

EXAMPLE 3

Figure 7A:
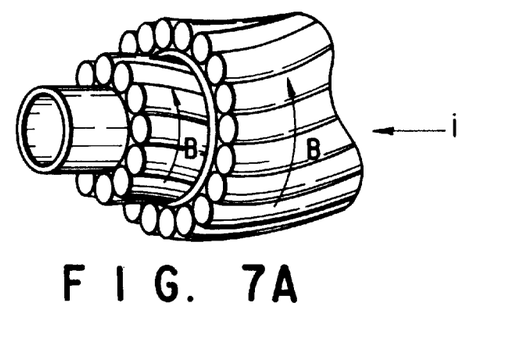
FIGS. 7A to 7C are views showing one example of the oxide superconductor cable of the present invention.

FIGS. 7A to 10D show various constructions of cables manufactured by winding a plurality of wires into a plurality of layers with an insulator between them around a core member. Of FIGS. 7A to 10D, FIGS. 7A, 8A, 9A, and 10A are perspective views, FIGS. 7B, 8B, 9B, and 10B are sectional views, and FIGS. 7C, 8C, 9C, 10C, and 10D are perspective views of a single wire. Note that FIGS. 7A to 7C illustrate a cable using round wires, and FIGS. 8A to 10D illustrate cables using tape wires. In FIGS. 7A to 10D, reference symbol B denotes an external magnetic field (the direction of a fluctuating magnetic field); and i, a current.

Figure 7B:
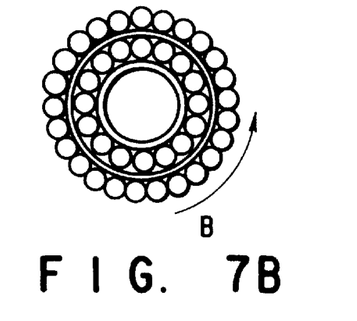
Figure 7C:
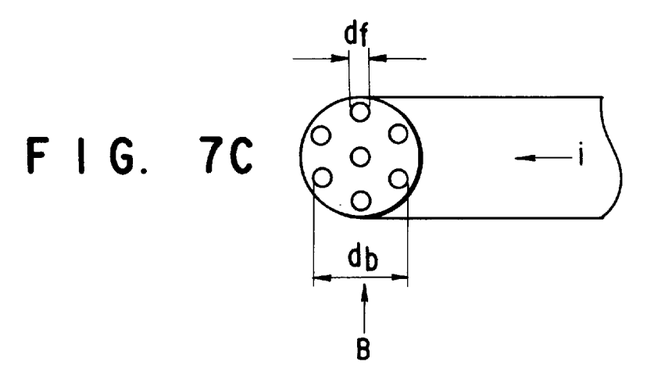
Figure 8A:
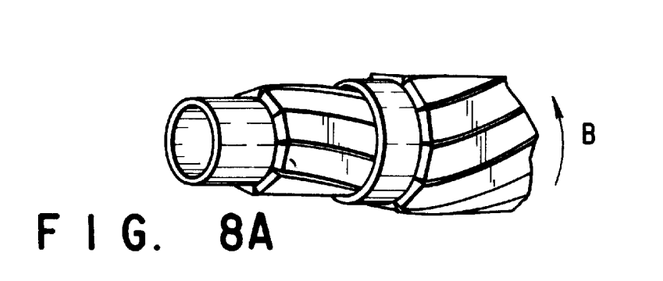
FIGS. 8A to 8C are views showing another example of the oxide superconductor cable of the present invention.
Figure 8B:
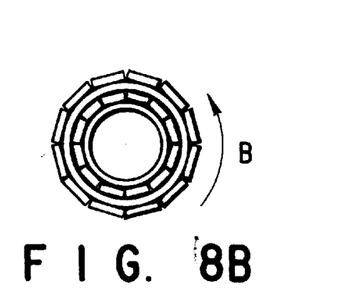
Figure 8C:
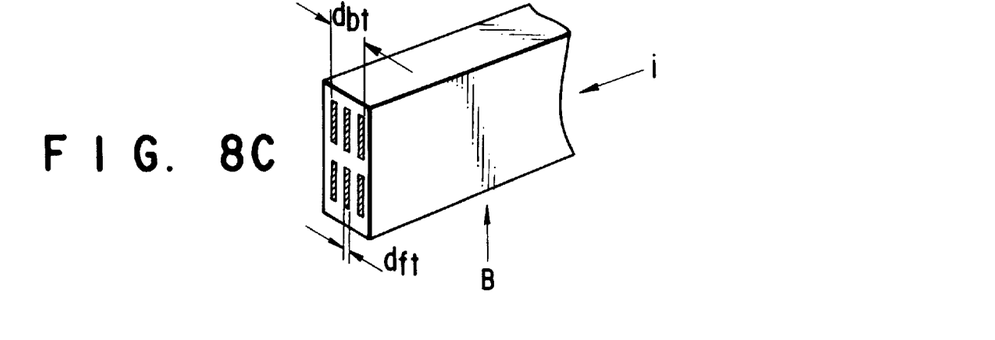
Figure 9A:
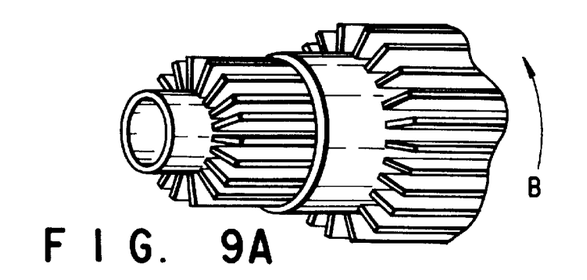
FIGS. 9A to 9C are views showing still another example of the oxide superconductor cable of the present invention.
Figure 9B:
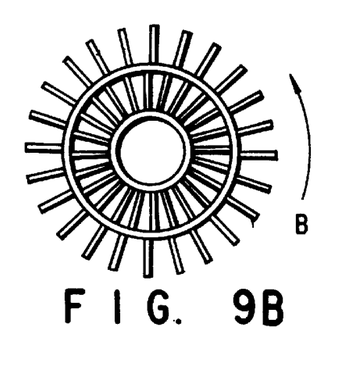
Figure 9C:
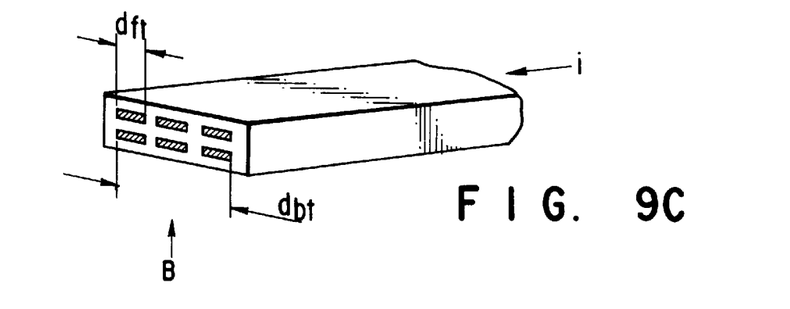
Figure 10A:
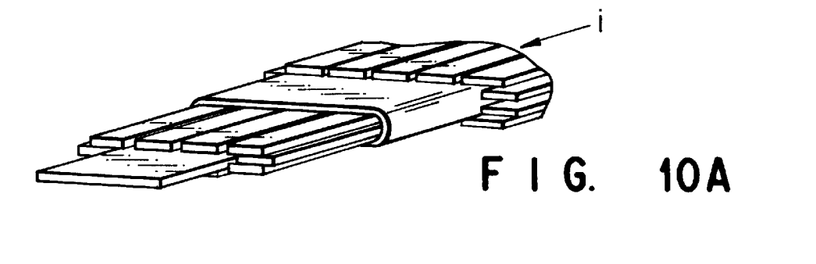
FIGS. 10A to 10D are views showing still another example of the oxide superconductor cable of the present invention.
Figure 10B:
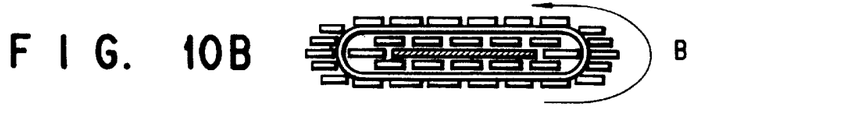
Figure 10C:
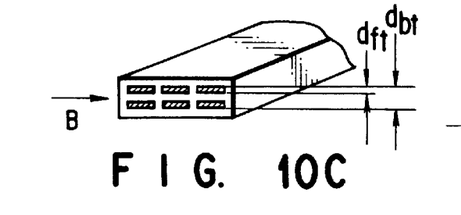
Figure 10D:
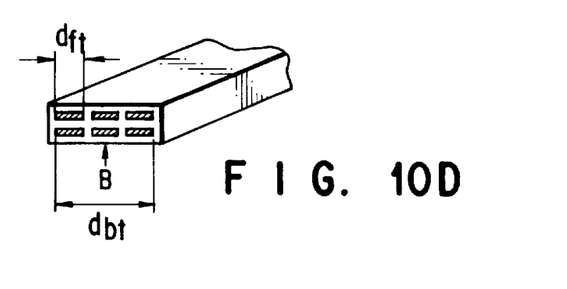

FIGS. 7A to 7C show a cable manufactured by winding a plurality of round wires into a plurality of layers around a cylindrical core member. FIGS. 8A to 8C show a cable manufactured by winding a plurality of tape wires into a plurality of layers around a cylindrical core member such that a wide surface of each tape is in contact with the core member. FIGS. 9A to 9C show a cable manufactured by radially winding a plurality of tape wires into a plurality of layers around a cylindrical core member such that a narrow surface of each tape is in contact with the core member. FIGS. 10A to 10D show a cable manufactured by arranging a plurality of tape wires into a plurality of layers around a flat core member. FIG. 10C shows one of tape wires arranged on the upper and lower surfaces of the core member. FIG. 10D shows one of tape wires arranged on the sides of the core member.

In the AC oxide superconductor wire of the present invention as has been described above, the twist pitch of superconductor filaments of the oxide superconductor wire is set in a predetermined range. This allows easy twisting and can also reduce the AC loss while suppressing a decrease of the critical current.

Also, in the method of manufacturing the AC oxide superconductor wire of the present invention, a heat treatment is performed before twisting is performed. Accordingly, it is possible to suppress a decrease in the critical current when the oxide superconductor wire is twisted at a small pitch.

Furthermore, the AC oxide superconductor cable of the present invention uses AC oxide superconductor wires whose twist pitches are so selected as to equalize the AC losses of wires in the individual layers when a rated current is applied to the cable. This prevents localization of the power supply current in each layer from and thereby prevents an abnormal increase of the AC loss.

Additional advantages and modifications will readily occur to those skilled in the art. Therefore, the invention in its broader aspects is not limited to the specific details and representative embodiments, shown and described herein. Accordingly, various modifications may be made without departing from the spirit or scope of the general inventive concept as defined by the appended claims and their equivalents.

We claim:

1. An AC oxide superconductor cable comprising a plurality of AC oxide superconductor round wires, each of said AC oxide superconductor round wires comprising:

a metal matrix; and a plurality of superconductor filaments embedded in said metal matrix, wherein said superconductor filaments are twisted at a twist pitch $L_p$ satisfying the following relations:

$2L_{c1} < L_p \leq 2L_{c2}$ $L_{c1} = 2\{(2\rho \cdot d_f \cdot J_c)/(\mu_o \cdot dH/dt)\}^{1/2}$ $L_{c2} = 2\{(2\rho \cdot d_b \cdot J_{cb})/(\mu_o \cdot dH/dt)\}^{1/2}$ where $\rho$ is a specific resistance ($\Omega \cdot m$) of said metal matrix, $d_f$ is a diameter (m) of each superconductor filament, $d_b$ is a diameter (m) of a bundle of superconductor filaments, $J_c$ is a critical current density (A/m$^2$) of each superconductor filament, $J_{cb}$ is a critical current density (A/m$^2$) of the bundle of superconductor filaments, $\mu_o$ is a permeability (H/m) in a vacuum, and dH/dt is a change rate (A/m/sec) of a magnetic field; and wherein said plurality of AC oxide superconductor round wires are arranged into a plurality of layers around a core member, and wherein the farther a layer is from said core member the closer the twist pitch $L_p$ to $2L_{c1}$, and the closer a layer is to said core member the closer the twist pitch $L_p$ to $2L_{c2}$.

2. A cable wire according to claim 1, wherein said superconductor filaments are made of an oxide superconductor which is one member selected from the group consisting of bismuth-based, yttrium-based, and thallium-based superconductors.

3. A cable according to claim 2, wherein said metal matrix is made of a silver alloy selected from the group consisting of Ag—Au, Ag—Cu, and Ag—Mg.

4. A cable according to claim 1, wherein said metal matrix is made of a silver alloy selected from the group consisting of Ag—Au, Ag—Cu, and Ag—Mg.

5. An AC oxide superconductor cable comprising a plurality of AC oxide superconductor tape wires, each of said AC oxide superconductor tape wires comprising:

a metal matrix; and a plurality of superconductor filaments embedded in said metal matrix, wherein said superconductor filaments are twisted at a twist pitch $L_p$ satisfying the following relations:

$2L_{c1} < L_p \leq 2L_{c2}$ $L_{c1} = 2\{(2\rho \cdot d_{ft} \cdot J_c)/(\mu_o \cdot dH/dt)\}^{1/2}$ $L_{c2} = 2\{(2\rho \cdot d_{bt} \cdot J_{cb})/(\mu_o \cdot dH/dt)\}^{1/2}$ where $\rho$ is a specific resistance ($\Omega \cdot m$) of said metal matrix, $d_{ft}$ is a thickness (m) of each superconductor filament, $d_{bt}$ is a thickness (m) of a bundle of superconductor filaments, $J_c$ is a critical current density (A/m$^2$) of each superconductor filament, $J_{cb}$ is a critical current density (A/m$^2$) of the bundle of superconductor filaments, $\mu_o$ is a permeability (H/m) in a vacuum, and dH/dt is a change rate (A/m/sec) of a magnetic field; and wherein said plurality of AC oxide superconductor tape wires are arranged into a plurality of layers around a core member, and wherein the farther a layer is from said core member the closer the twist pitch $L_p$ to $2L_{c1}$, and the closer a layer is to said core member the closer the twist pitch L to $2L_{c2}$.

6. A cable wire according to claim 5, wherein forming said superconductor filaments are made of an oxide superconductor which is one member selected from the group consisting of bismuth-based, yttrium-based, and thallium-based superconductors.

7. A cable according to claim 6, wherein said metal matrix is made of a silver alloy selected from the group consisting of Ag—Au, Ag—Cu, and Ag—Mg.

8. A cable according to claim 5, wherein said metal matrix is made of a silver alloy selected from the group consisting of Ag—Au, Ag—Cu, and Ag—Mg.

* * * * *